United States Patent [19]

Lohstroh

[11] 4,399,450
[45] Aug. 16, 1983

[54] ROM WITH POLY-SI TO MONO-SI DIODES

[75] Inventor: Jan Lohstroh, Eindhoven, Netherlands

[73] Assignee: U.S. Philips Corporation, New York, N.Y.

[21] Appl. No.: 219,059

[22] Filed: Dec. 22, 1980

Related U.S. Application Data

[63] Continuation of Ser. No. 957,628, Nov. 3, 1978.

[30] Foreign Application Priority Data

Nov. 28, 1977 [NL] Netherlands ..................... 7713051

[51] Int. Cl.³ ................... H01L 27/04; G11C 17/06
[52] U.S. Cl. ................................. 357/59; 357/45; 365/105
[58] Field of Search .............. 357/92, 15, 59, 45; 365/103, 105

[56] References Cited

U.S. PATENT DOCUMENTS

| | | | |
|---|---|---|---|
| 4,070,654 | 1/1978 | Tachi | 357/92 |
| 4,099,260 | 7/1978 | Lynes et al. | 357/15 |
| 4,148,055 | 4/1979 | Edlinger et al. | 357/92 |
| 4,160,989 | 7/1979 | deBribisson et al. | 357/92 |

FOREIGN PATENT DOCUMENTS 54-16990  2/1979  Japan ........................... 357/59 R

OTHER PUBLICATIONS

Davies et al., IEEE J. of Solid State Circuits, vol. SC 12, No. 4, Aug. 1977, pp. 367–375.

*Primary Examiner*—William D. Larkins
*Attorney, Agent, or Firm*—James J. Cannon, Jr.

[57] ABSTRACT

In a diode matrix of a permanent memory (ROM) the word line and bit line system is formed by a system of strip-shaped zones of one conductivity type provided in the silicon body and in the another system is formed by polycrystalline silicon tracks of the opposite conductivity type provided on the surface and forming mono-poly p-n junctions with the strip-shaped zones. High packing density and high speed are obtained.

7 Claims, 14 Drawing Figures

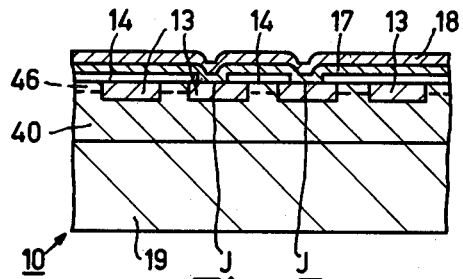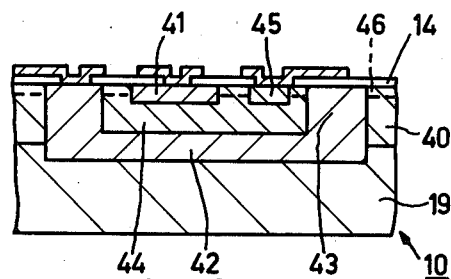
Fig. 7a  Fig. 7b
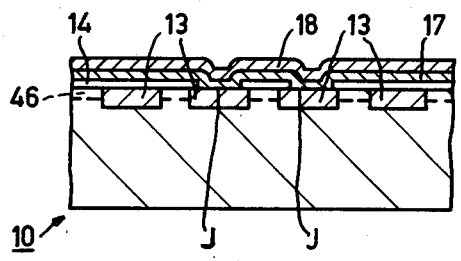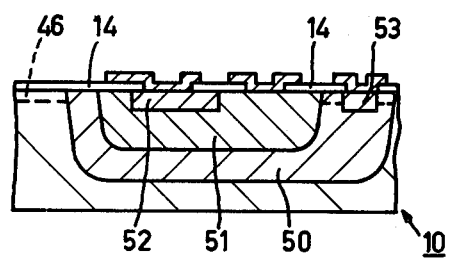
Fig. 8a  Fig. 8b
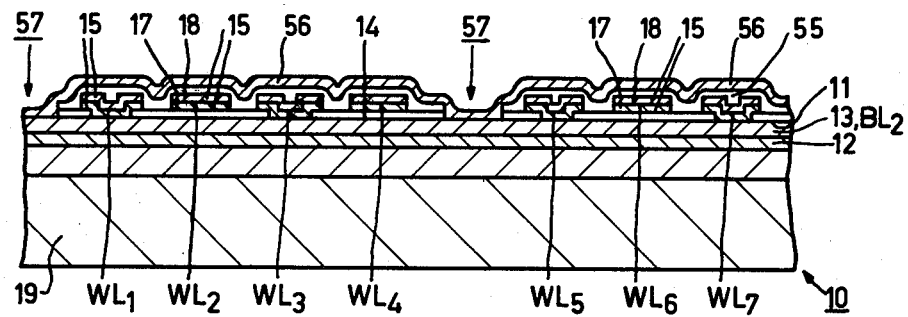
Fig. 9
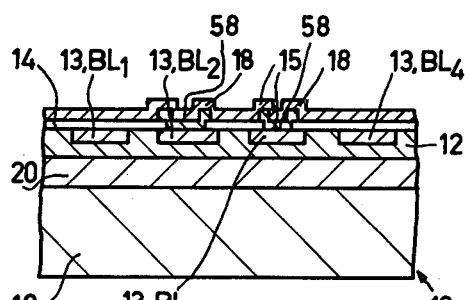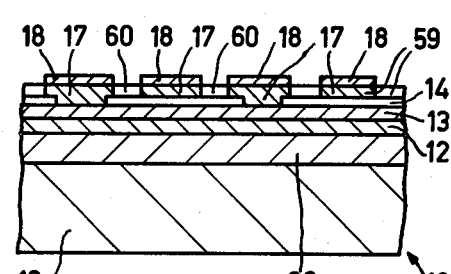
Fig. 10  Fig. 11

ROM WITH POLY-SI TO MONO-SI DIODES

This is a continuation of application Ser. No. 957,628, filed Nov. 3, 1978.

BACKGROUND OF THE INVENTION

1. Field of the Invention

This invention relates to a semiconductor device having a fixed memory, comprising a semiconductor body having a surface-adjoining surface region of a first conductivity type in which a number of juxtaposed, parallel strip-shaped surface zones of the second conductivity type are provided, the surface being covered with an insulating layer on which a number of juxtaposed, parallel strip-shaped conductor tracks are provided which cross the strip-shaped surface zones, in which depending on the information stored in the memory, the conductor tracks at the area of some of the crossings, can be connected to the strip-shaped zones by a rectifying junction through windows in the insulating layer.

2. Description of the Prior Art

The invention relates in addition to a method of manufacturing such a device.

Memories of the above-described kind are generally known and are usually referred to in literature by the abbreviation ROM (read only memory). The strip-shaped surface zones situated in the body and the conductor tracks provided on the insulating layer constitute a cross-bar system of address lines and read lines for selecting and reading the memories at the crossings. The information (logic 1 and 0 or conversely) corresponds to the presence or absence of a diode connection at the area of the crossings between the address lines.

In general, rapid diodes should be used in said types of memories, that is to say, diodes having short switching times and/or recovery times. Such a semiconductor device is known from the article "A Bipolar 16K ROM Utilizing Schottky Diode Cells" by J. F. Gunn et al., IEEE International Solid-State Circuits Conference 1977, pp. 118/119. In the semiconductor memory described in said article the conductor tracks (word lines) are formed by strips of a metal which, through windows in the insulating layer, form a rectifying Schottky junction with the strip-shaped surface zones in the semiconductor body. The strip-shaped surface zones, termed bit lines, consist of three sub-zones, namely a comparatively low-doped central zone which forms the Schottky junctions with the metal tracks, and two comparatively highly doped zones on either side of the central zone. This structure is comparatively compact and has the additional advantage that, as described in the publication, standard bipolar technologies may be used for the manufacture thereof. As a result of this, further circuit elements, such as transistors, necessary for selecting and/or reading the memory and possibly also for the further processing of the stored information, can be integrated in the same semiconductor body, as is usually desired.

In this known device, the highly doped subzones which are situated on either side of the central sub-zone and which primarily determine the resistances of the bit-lines and are separated laterally from the Schottky junction, occupy much space, at least as compared with the (imaginary) case in which said highly doped zones would coincide with the central zone. However, such a configuration is not possible because usually good and reliable Schottky junctions can be formed only on comparatively high-ohmic semiconductor material. Principally only ohmic (that is to say non-rectifying) contacts can be obtained on low-ohmic material.

SUMMARY OF THE INVENTION

One of the objects of the invention is to provide a semiconductor device having a permanent memory in which the bit line diffused or implanted in the semiconductor body is formed by a single surface zone the resistivity of which is so low that separate low-ohmic zones situated on either side of said surface zone are not necessary, so that the space occupied by the device is considerably reduced.

A further object of the invention is to provide a simple method of manufacturing a semiconductor device having a permanent memory and having a particularly compact structure in which other circuit elements, such as transistors, can preferably also be provided in the same semiconductor body.

The invention is based on the recognition of the fact that good rectifying junctions, also with higher doping concentrations of the bit lines, can be obtained by providing the word lines in the form of deposited semiconductor material which does not form a Schottky junction but forms a p-n junction with the bit lines which may be used as a diode in a matrix of a ROM.

A semiconductor device according to the invention is characterized in that, at least at the area of said windows, parts of the conductor tracks are formed by semiconductor material which is deposited at least on the surface of the semiconductor body in the windows, which material is of the first conductivity type opposite to the conductivity type of the zones and forms said rectifying junctions at the area of the windows in the form of p-n junctions.

Since the possibility that instead of a rectifying junction, an ohmic connection is formed, as may be the case in metal-to-semiconductor junctions, will not occur in a semiconductor device according to the invention, the doping concentration of the strip-shaped surface zones can be chosen to be sufficiently high as desired with a view to conductibility. Separate highly doped zones are hence not necessary so that in comparison with the above-described known device a considerable space saving can be obtained.

The semiconductor material which is deposited in the windows and on the insulating layer advantageously has a polycrystalline structure.

The process step in which said polycrystalline material is deposited can advantageously be carried out at a comparatively low temperature, that is to say, at such a low temperature that the properties of circuit elements already present in the semiconductor body are not adversely influenced. Since charge carriers which are injected from the monocrystalline semiconductor body in the polycrystalline material as a result of recombination centers which in general are present to a more considerable extent in polycrystalline material than in monocrystalline material, will recombine rapidly, as will the charge carriers which are injected by the polycrystalline material in the highly doped monocrystalline part of the diodes, the recovery time of said type of diodes will generally be short and hence the rate at which the device can be operated will be high.

A preferred embodiment with which, as experiments have demonstrated, the speed of the diodes can also be improved is characterized in that a metal layer is provided on the deposited semiconductor material above each of the diodes. A possible explanation for this may be found in the large number of recombination centers which are induced by the metal in the deposited semiconductor material and which, with the usual thickness of the deposited semiconductor material (approximately 0.5 μm), are situated sufficiently closely to the p-n junctions so as to reduce the life of the injected charge carriers at that area.

The metal preferably extends over the whole or at least substantially the whole length of the said conductor tracks so that the resistances in the conductor tracks can be kept low. In such an embodiment the deposited semiconductor material may be provided in the form of discrete spots principally in the windows in the insulating layer. A preferred embodiment which has the advantage of a flat structure is characterized in that the conductor tracks each comprise a double layer of a track of semiconductor material of the first conductivity type which extends over the whole length of the conductor track in the windows and over the insulating layer and a track of a metal which is provided over the whole length of the conductor track on the deposited semiconductor material. In order to obtain diodes having a low-stray capacity and a good (high) breakdown voltage, the doping concentration of the polycrystalline material is preferably at most $10^{18}$ atoms/cm$^3$. For the surface doping concentration of the strip-shaped zones at least $10^{19}$ atoms/cm$^3$ is chosen both to obtain low series resistances in the strip-shaped zones and to obtain a high recombination rate.

The invention relates in addition to a method of manufacturing a semiconductor device having a permanent memory (ROM) in which the semiconductor body having a surface-adjoining surface region of mainly a first conductivity type is provided with a number of juxtaposed, parallel strip-shaped surface zones of the second conductivity type, and an insulating layer is formed on the surface and a number of juxtaposed, strip-shaped parallel conductor tracks are formed on the insulating layer and cross the strip-shaped surface zones, in which, at the area of the crossings, the insulating layer has or does not have windows, dependent on the information, through which windows the conductor tracks can be connected to the surface zones by a rectifying junction. According to a second aspect of the invention such a method is characterized in that, at least at the area of said windows, the conductor tracks are provided in the form of semiconductor material which is deposited on the exposed surface of the semiconductor body in the windows and on the insulating layer, which material is of the first conductivity type which is opposite to the conductivity type of the surface zones and which at the area of the windows forms rectifying p-n junctions with the surface zones. The semiconductor material is preferably deposited in a polycrystalline form.

BRIEF DESCRIPTION OF THE DRAWINGS

The invention will be described in greater detail with reference to a few embodiments and the accompanying diagrammatic drawing, in which

FIGS. 7a, b are two sectional views of a third embodiment of the semiconductor device according to the invention;

FIGS. 8a, b are two sectional views of a fourth embodiment of a semiconductor device according to the invention;

FIG. 9 is a sectional view of a part of a further embodiment of a device according to the invention;

FIG. 10 is a sectional view of another modified embodiment of a device according to the invention;

FIG. 11 is a sectional view of still another modified embodiment of a device according to the invention.

DESCRIPTION OF THE PREFERRED EMBODIMENT

Figure 1:
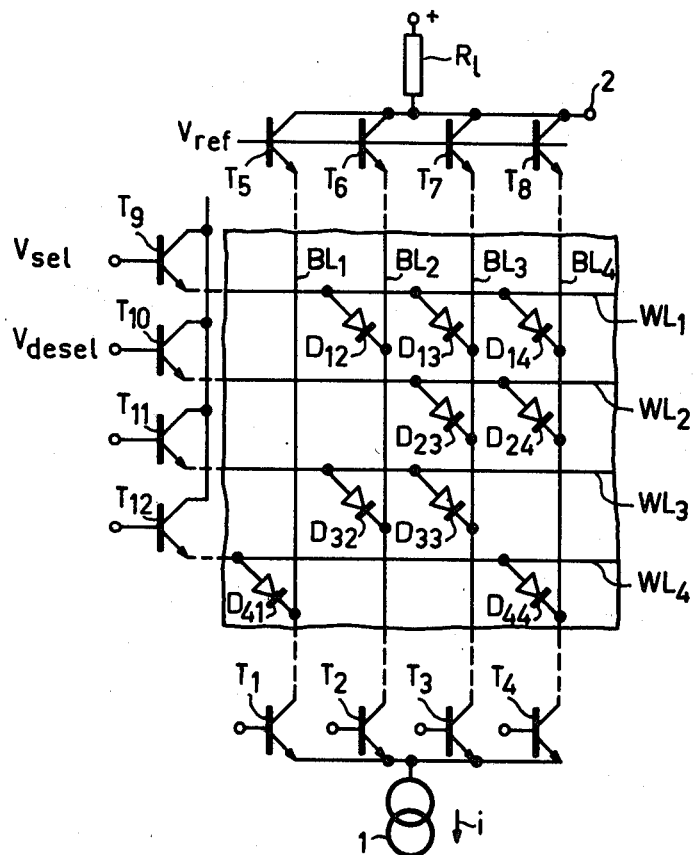
FIG. 1 shows a part of a circuit diagram of a semiconductor device according to the invention.

FIG. 1 shows by way of example a diagram of a permanent semiconductor memory of the type to which the invention relates. Of course other circuit diagrams may also be used when the matrix structure remains the same. The device comprises a cross-bar system of (vertical) read/bit lines $BL_1$–$BL_4$ and (horizontal) address-/word lines $WL_1$–$WL_4$. The information is formed by a system of diodes arranged in rows and columns at the area of the crossings of the word lines and bit lines. The presence or absence of a diode between a word line and a bit line at a given crossing then represents a logic "1" and "0" or conversely. Dependent on the place in the cross-bar system the diodes in FIG. 1 are denoted by the symbols $D_{xy}$, where the index x denotes which place the diode occupies in the row, while y denotes the place in a column. The bit lines $Bl_1$–$Bl_4$ are connected, by the transistors $T_1$–$T_4$, to a current source 1 which supplies a current i. By the transistors $T_5$–$T_8$ and the load resistor R the bit lines are connected on the other side to the positive side of the supply. The base zones of the transistors $T_5$–$T_8$ are connected in common to a reference voltage $V_{ref}$. The word lines $Wl_1$–$Wl_4$ are connected to the emitters of the selection transistor $T_9$–$T_{12}$. The selection may be carried out by means of the transistors $T_1$–$T_4$ as far the columns are concerned and by means of the transistors $T_9$–$T_{12}$ as far as the rows are concerned. When by way of example the memory site $D_{12}$ is to be read, the bit lines $Wl_2$ can be selected by means of $T_2$ and the word line $Wl_1$ can be selected by means of $T_9$, in which a selection voltage Vsel higher than Vref is applied to the base of $T_9$ and a voltage Vdesel smaller than Vref is applied to the basis of transistor $T_{10}$–$T_{12}$ of the lines not to be selected. Vsel may be chosen to be high (for example 1400 mV higher than Vref.) so that the current i can flow to the transistor $T_2$ through the collector of $T_9$, the word line $Wl_1$, the diode $D_{12}$ so that a comparatively high voltage or logic "1" can be read at the output 2. When, however, the bit line $Bl_2$ and the word line $Wl_2$ are selected, the current i, in the absence of a diode at the crossing $Bl_2$–$Wl_2$, can be supplied only by the —opened—transistor $T_6$. In this case the voltage at the output 2 drops and a logic "0" can be read. In this manner any crossing of the 4×4 matrix shown in FIG. 1 can be selected and read. A specific embodiment in which the number of memory sites will be much larger than in the 4×4 matrix formed in this case, can be obtained in a simple manner by expansion of the matrix shown in FIG. 1, for example, by juxtaposing a number of groups in the horizontal direction, so that with each selection a word can be read, and by simply increasing the length in the columns in the vertical direction. Other organizations in which several bits can be read simultaneously are also possible of course.

In connection with the large number of memory sites it is in general of importance for each diode to be as small as possible so as to keep in this manner the overall dimensions of the semiconductor device within acceptable limits. In connection with the speed with which the device can be operated, it is furthermore of importance for the diodes to be also rapid, in addition to small, that is to say to show short recovery times. In addition, the manufacturing process of the diodes is preferably of such a nature that other circuit elements, for example the transistors $T_1$–$T_{12}$, the current source 1, the load resistor R and so on, can also be integrated with the diodes in the same semiconductor body.

A first embodiment of a device according to the invention will be described with reference to FIGS. 2 to 4, in which FIG. 2 only shows a plan view of the part of the semiconductor body comprising the 4×4 diode matrix shown in FIG. 1. The device (see also FIG. 3) comprises a semiconductor body of silicon. A surface region 12 which is mainly of a given conductivity type is situated at the surface 11. In the case described here the surface region is of the p-conductivity type but it will be obvious that this conductivity type can be reversed simultaneously with all subsequent conductivity types. A number of juxtaposed, substantially parallel strip-shaped surface zones 13 of the second conductivity type, hence of the n-conductivity type, are provided in the p-type surface region 12. Said n-type zones 13 which correspond to the read/bit-lines $Bl_1$–$Bl_4$ in FIG. 1 are also provided with the reference symbols $Bl_1$–$Bl_4$ in FIGS. 2 to 4 for mutual distinction.

Figure 2:
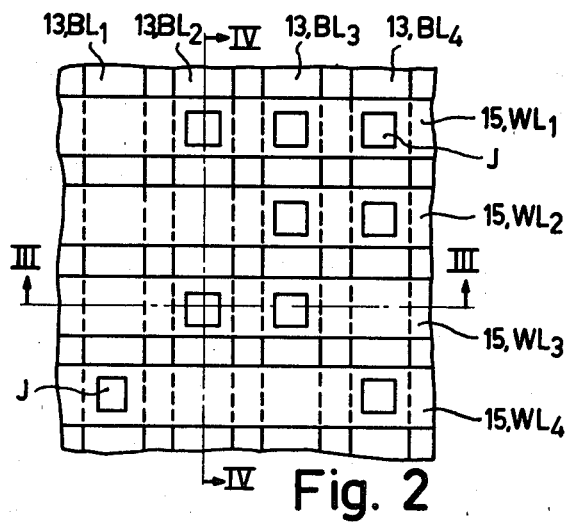
FIG. 2 is a plan view of a part of the matrix part of this device.

The surface 11 is covered with an insulating layer 14 which is not shown in FIG. 2 for clarity. In this case the layer 14 is of silicon-oxide but of course other dielectric materials, for example silicon nitride or a combination of different materials, may alternatively be used. Instead of an insulating material, a semi-insulating material, for example polycrystalline silicon material (possibly doped with oxygen) which comprises no or substantially no donors or acceptors, may alternatively be used.

A number (four in the figures) of parallel strip-shaped conductor tracks 15 are provided on the insulating layer 14 and cross the strip-shaped surface zones 13. The tracks 15 which correspond to the word lines $Wl_1$–$Wl_4$ in FIG. 2 for mutual distinction are connected, dependent on the information, to the strip-shaped zones 13 by a rectifying junction.

For that purpose, according to the invention, the conductor tracks 15, at least at the area of the windows 16 in the oxide layer 14 where said rectifying junctions are to be formed, are provided in the form of semiconductor material 17 which is deposited on the insulating layer 14 and in windoes 16 in the insulating layer 14. In the embodiments described said semiconductors material 17 extends throughout the length of the word lines 15. In other embodiments, however, the semiconductor material 17 may alternatively be provided mainly only in the windows 16 in the silicon oxide layer 14.

The semiconductor material 17 is of the first conductivity type opposite to the conductivity type of the n-type surface zones 13, hence of the p-conductivity type. In the windows 16 the strips 17 form rectifying p-n junctions J (FIGS. 3 and 4) which correspond to the diodes D in the circuit diagram shown in FIG. 1.

The dimensions of the diodes which are determined mainly only by the size of the windows 16 in the oxide layer 14 may be very small so that the packing density of the device can be very high. As a result of the small dimensions of the diodes and the associated small stray capacitances, comparatively large speeds can in addition be obtained.

The strip-shaped semiconductor layers 17 are provided in a polycrystalline form so that the rectifying junctions J coincide entirely or at least substantially with the junction with the polycrystalline material of the strips 17 and the mono-crystalline material of the semiconductor body 10. The charge carriers which are injected from the monocrystalline semiconductor material in the polycrystalline material will disappear rapidly as a result of the comparatively large number of recombination centers in the polycrystalline semiconductor material. Holes which are injected in the highly doped n-zones 13 by the polycrystalline material also have a comparatively small life as a result of the high doping concentration in the zones 13. The diodes J will thus show short-recovery times and hence a high speed.

The doping concentration of the n-type surface zones 13 is chosen to be at least 10 times higher than the doping concentration of the polycrystalline strips 17.

As a result of this, the stray capacitances of the diodes can be kept low, which is also of importance for the speed at which the device can be read. An additional advantage is that as a result of the lower doping concentration in the polycrystalline material higher breakdown voltages can be obtained.

In order to obtain a lowest possible series resistance in the bit lines Bl, a value of at least $10^{19}$ atoms/cm$^3$ has been chosen for the surface concentration of the zones 13. Specific values for the surface concentration are $10^{19}$–$10^{20}$ $\mathit{l\,donors\,per\,cm^3}$. The series resistance of the word lines can be kept low by constructing the conductor tracks 15 as a double layer which in addition to the polycrystalline semiconductor tracks 17 also comprises strips 18 of a readily conductive material, for example aluminum, which are provided on strips 17. The resistivity of the polycrystalline layers 17 has substantially no influence any longer on the series resistance in the word lines Wl as compared with the metal layer 18 so that for the doping concentration in the polycrystalline layer a low value can be chosen—preferably lower than $10^{18}$ atoms/cm$^3$—which in connection with the above-described properties of the diode is desired. Specific values for this doping concentration are between $10^{15}$ and $10^{17}$ atoms/cm$^3$.

An additional advantage of the metal layers 18 resides in the fact that, as has already described, the speed of the diodes proves to be further increased, probably as a result of the formation of recombination centers in the semiconductor material 17. In connection herewith it is to be noted that in the case in which the polycrystalline tracks 17 are constructed to be so low-ohmic that the metal tracks 18 are not required in connection with the resistance in the word line 15, it may nevertheless be of advantage in this case to provide metal, for example, aluminum, on the tracks 17 at least above the windows 16.

The poly-mono junctions described are particularly suitable as memory elements in a permanent memory of the kind described due to their speed and small dimensions—for example 10×10 mm$^2$—or even smaller, and due to the fact that the zones 13 can be provided so as to be very close together. In addition the manufacture of the elements is compatible with bipolar transistors of the kind which is common in conventional integrated circuits so that peripheral electronics with the transistors $T_1-T_{12}$ (FIG. 1) can be provided in a common semiconductor body with the diodes. In order to illustrate this, FIGS. 5a and 5b are two sectional views of the device during a stage of the manufacture thereof in which the cross-section shown in FIG. 5a corresponds to the sectional view shown in FIG. 4, while FIG. 5b shows another part of the device which comprises a transistor.

Starting material for the manufacture of the device may be a semiconductor body 10 usual for integrated circuits and consisting of a p-type substrate 19 having a resistivity between 1 and 100 Ohm.cm and an n-type epitaxial layer 20 deposited on the substrate in a thickness of approximately 3 $\mu$m and having a resistivity between 0.1 and 10 ohm.cm. At the area where bipolar transistors are provided, highly doped buried n-type collector zones 21 may be formed on the interface between the substrate 19 and the epitaxial layer 20, as shown in FIG. 5b.

Mutually insulated islands can be formed in the epitaxial layer 20 in the usual manner by means of insulation regions 22. In the present embodiment deep p-type zones, that is to say zones extending down to the substrate, are used for the island insulation regions 22. In other embodiments, however, said p-type zones may alternatively be replaced by regions of a dielectric material, for example silicon oxide, or by grooves etched in the epitaxial layer 20.

Figures 5A, 5B:
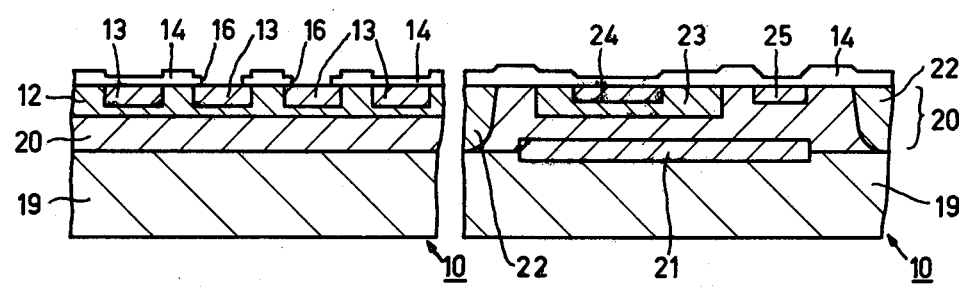
FIGS. 5a, b are two sectional views of the said device during the manufacture thereof.

The base zone 23 of the npn transistor shown in FIG. 5b may then be formed by diffusion of boron atoms, with a usual surface concentration between $10^{18}$ and $10^{19}$ atoms/cm$^3$ and a depth of 1.5 $\mu$m. Simultaneously the p-type surface region 12 may be provided in which the bit lines Bl will be formed in a subsequent process step. In the case in which lower doping concentrations are desired for the region 12, a separate doping step may of course be used for said regions. The n+ emitter zone 24 and the collector zone 25 may then be provided by means of known masking and diffusion methods (FIG. 5b). The surface concentration of the zones 24, 25 is between $10^{19}$ and $10^{20}$ atoms/cm$^3$ and the depth is approximately 1 $\mu$m. Simultaneously with the emitter diffusion or in a separate step the n+ type bit lines 13 may be provided. Comparatively low resistances can be obtained in the bit lines; a specific resistance value is between 5 and 15 ohm per square.

For the deposition of the p-type polycrystalline material, windows are etched in the oxide layer 14 at the surface 2 in those places where the word lines and bit lines are to be interconnected by a diode (FIG. 5a). As shown in FIG. 5b, no contact windows 16 are provided in the oxide layer 14 above the transistors. If desired, however, a base contact window could be formed now already above the base zone 13 via which window the p-type base could be provided with a base contact. In the case described here, however, the base-emitter contact and collector contacts are provided in the form of aluminum contacts.

Figures 3, 4:
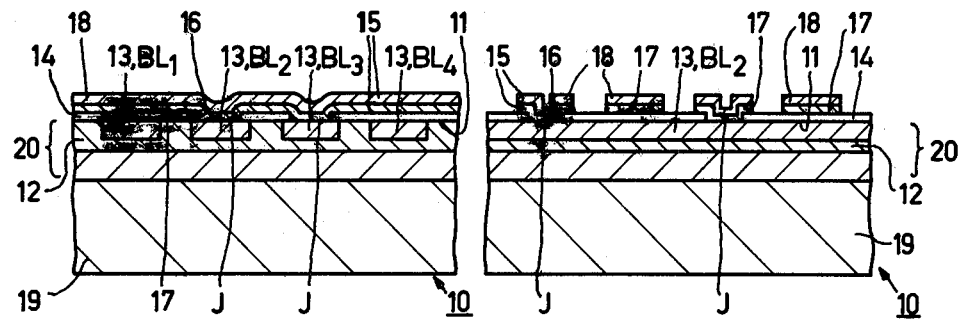
FIG. 3 is a sectional view of said device taken on the line III—III of FIG. 2.
FIG. 4 is a sectional view of the same device taken on the line IV—IV of FIG. 2.

It is to be noted that the oxide layer 14 which in FIGS. 3 and 4 is shown for clarity as a layer having a uniform thickness, actually has a non-uniform thickness, as a result of the various treatments, as is shown for completeness' sake in FIGS. 5a and b.

The polycrystalline silicon material 17 is then deposited on the oxide layer and in the windows 16 so as to obtain word lines 15. The thickness of the layers 17 is approximately 0.5 $\mu$m and the doping concentration is at most $10^{18}$ boron atoms per cm$^3$. High-temperature steps are not necessary, which is of advantage in connection with the properties of the other circuit elements, for example the transistors $T_1-T_{12}$.

In a subsequent process step the contact windows above the emitter 24 and base 23 and the collector contact zone 25 may be provided, after which the emitter, base and collector contacts are formed in the usual manner by deposition of aluminum. Simultaneously the aluminum tracks 18 may be provided on the poly-crystalline strips so as to reduce the series resistance in the word lines 15.

Figure 6:
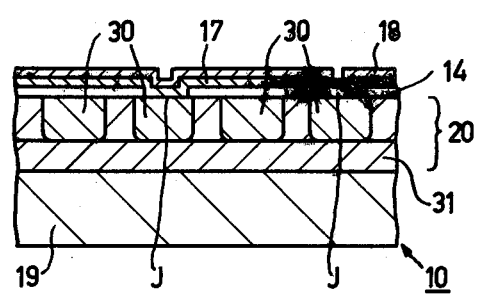
FIG. 6 is a sectional view of a second embodiment of the semiconductor device according to the invention.

In the embodiment described the bit lines are formed by highly doped and low-ohmic zones 30 which are provided during the emitter diffusion. FIG. 6 is a sectional view corresponding to the sectional view shown in FIG. 3 of an embodiment which is slightly varied with respect to the first embodiment. For components which correspond to components shown in FIG. 3 the same reference numerals are used for simplicity. In this case the bit lines are formed by p-type surface zones 30 instead of by n-type zones, while the poly-crystalline layer 17 is of the n-type. The p-type zones 30 is provided directly in the n-type epitaxial layer 20 and are insulated from each other by intermediate parts of the epitaxial layer. The p-type zones 30 extend throughout the thickness of the epitaxial layer 20 and are separated on the lower side from the p-type substrate 19 by a highly doped n-type buried layer 31.

The device shown in FIG. 6 may be manufactured by means of a process which is substantially equal to the process described hereinbefore with reference to the first embodiment: the zone 31 may be provided simultaneously with the buried collector zone 21 shown in FIG. 5b and the p-zones 30 may be provided simultaneously with the p-type insulation zone 22. However, instead of a p-type polycrystalline layer 17, n-type polycrystalline layers are now provided.

By providing the zones 30 simultaneously with the insulation zones 12, bit lines having a low series resistance can be obtained. A specific value for these resistances is between 5 and 15 ohm per square. Since in addition the said zones have comparatively high surface doping concentration, rapid diodes J can be obtained at a comparatively low (for example $10^7$ atoms/cm$^3$) doping concentration in the n-type polycrystalline layers as in the preceding example, which diodes, also due to their small dimensions, are particularly suitable as memory elements in a dead memory.

FIGS. 7a and 7b are sectional views, corresponding to the sectional views shown in FIGS. 5a and 5b, of a third embodiment of a device according to the invention. In this case the semiconductor body 10 comprises a p-type epitaxial layer 40 instead of an n-type epitaxial layer 20, as in the preceeding embodiments. The layer 40 is provided on a p-type substrate 19. The bit lines and the word lines, as in the first embodiments, comprise n+ type surface zones 13 and the p-type polycrystalline silicon strips 17, respectively, with all Al tracks 18 provided thereon. The n-type zones 13 may be formed again simultaneously with the n-type emitter 41 of the transistor (FIG. 7b). In this case the collector of the transistor is formed by an n-type buried layer 42 and the annular n-type zone 43 which extends from the surface down to the buried layer 42 over the epitaxial layer 40. The base of the transistor is now formed by a part 44 of the epitaxial layer 40 which is surrounded by the collector 42, 43 and has a p+ type base contact zone 45. The n-type zones 13 and the transistors in this case are each separated from other circuit elements by intermediate parts of the p-type epitaxial layer 40. Separate zones for island insulation are not necessary in this case, so that in particular the peripheral electronics can be manufactured with greater packing density than in the first embodiment. The manufacture of the device shown in FIGS. 7a and 7b may furthermore be carried out by means of known methods. If desired, the doping concentration of p-type impurities at the surface of the epitaxial layer 40 below the oxide layer 14 may be increased so as to prevent channel formation as a result of inversion. Such a channel stopping zone 46 which may be provided by means of a uniform doping over the whole surface of the semiconductor body is shown in broken lines in the figure.

A memory device according to the invention may alternatively be manufactured by means of a process in which the transistors are provided by means of a threefold diffusion or implantation, as is shown in FIGS. 8a and b. Starting material in this case is the p-type semiconductor body 10 which, if desired, may be provided again with a channel stopping zone 46 at the surface below the oxide layer 14. By means of diffusion or ion implantation, the collector 50 (FIG. 8b) is provided herein, the p-type base zone 51 is provided in the collector and the n-type emitter zone 52 finally is provided in the base simultaneously with the n+-type collector contact zone 53. The n-type bit lines 13 are formed by the highly doped n+ type zones 13 (FIG. 8a) which are also provided simultaneously with the emitter zone 52 and the collector zone 53 of the transistor and form the rectifying junction J with the lower-doped p-type polycrystalline silicon layers 17. The same or approximately the same values as in the first embodiment may be taken for the doing concentrations of the n+ zones 13 and the p-type polycrystalline layers 17.

In some cases in which, for example, selection/reading methods other than those described with reference to FIG. 1 are used, it may be of advantage to further reduce the series resistances in the word lines Wl. FIG. 9 shows a manner in which such a resistance reduction can be obtained. The device shown in FIG. 9 is equal for the greater part to the device shown in the embodiment of FIGS. 2–4. The sectional view shown in FIG. 9 corresponds to the sectional view shown in FIG. 4, in which for clarity the word lines Wl$_5$–Wl$_7$ are shown which are shown in FIG. 4. Above the surface 11 metal tracks 56 are provided above each of the n-type bit lines 13. The tracks 56 are electrically insulated from the word lines 15 by an intermediate insulating layer 55 of, for example, silicon oxide. Via windows 57 in the oxide layers 14, 55 the tracks 56 which extend substantially parallel to the bit lines 13 across the oxide layer 55, are contacted with the underlying bit lines 13 in a number of places. Due to the relative low-ohmic condition present in the n-zones 13, it is in general not necessary to provide a contact between the zone 13 and the strips 56 at the area of each memory site but a contact each time only after a certain number of memory sites will suffice. For simplicity, a contact 57 is shown in the figure every four memory sites. Actually, dependent on the requirements to be imposed, far fewer contacts will often suffice so that the packing density of the device need hardly be reduced due to the present to the contacts 57.

FIG. 10 is a sectional view corresponding to the sectional view shown in FIG. 3 of a further modified embodiment of the first embodiment. Instead of continuous polycrystalline silicon strips 17 the word lines 15 now comprise spots 58 of polycrystalline material which are provided in those memory sites where diodes J are to be formed, while in other places the polycrystalline material is removed. The polycrystalline spots 58 are interconnected by the Al-tracks 18 which extend over the whole length of the word lines 15 as in the first embodiment.

FIG. 11 finally is a sectional view corresponding to the sectional view shown in FIG. 4 of another modified embodiment of the device according to the first embodiment. In this case a substantially non-doped polycrystalline silicon layer 59 is provided on the oxide layer 14. The resistance of the polycrystalline material is so high that it may be used advantageously as an insulation material. By means of diffusion or ion implantation, p-tracks 17 corresponding to the tracks 17 in the first embodiment are provided in the layer 59. The tracks 17 are insulated from each other by intermediate undoped and high-ohmic parts 60 of the polycrystalline layer 59. Further parts of the intrinsic layer 49 outside the matrix part of the device may be p-type and/or n-type doped in behalf of, for example, the wiring of the peripheral electronics.

It will be obvious that the invention is not restricted to the examples described but that many variations are possible to those skilled in the art without departing from the scope of this invention. For example, in addition to bipolar transistors, field effect transistors, for example of the type having insulated gate electrodes, may be intergrated in the same semiconductor body with the memory matrix of the above-described kind. For example, the bit lines may be provided simultaneously with the provision of the source and drain zones of the transistors and the polycrystalline word lines may be provided simultaneously with the integrated gate electrodes. In the embodiments described the information is provided during the manufacture of the devices by means of the mask which defines the window 16 in the oxide layer. Programmable memories, however, are also feasible within the scope of the invention. For example, use may be made of fuses (fusible links) between the Al-tracks 18 and the polycrystalline tracks 17.

What is claimed is:

1. A semiconductor device having a permanent memory, comprising:
   a semiconductor body having a surface-adjoining surface region of mainly a first conductivity type;
   a number of juxtaposed, parallel strip-shaped surface zones of the second conductivity type provided on said region;
   said surface being covered with an insulating layer;
   a number of juxtaposed, parallel strip-shaped conductor tracks provided on said insulating layer which cross said strip-shaped surface zones;
   said conductor tracks at the area of the crossings being connected to said strip-shaped zones by a rectifying junction through windows in said insulating layer depending on the information stored in the memory, characterized in that,
   at least parts of said conductor tracks are formed by semiconductor material deposited at least on the surface of said semiconductor body in the windows, which material is of the first conductivity type opposite to the conductivity type of said strip-shaped zones, forming said rectifying junctions at the area of said windows in the form of p-n junctions, said semiconductor material deposited in said window having a polycrystalline structure;

the doping concentration of the deposited semiconductor material being lower than the surface concentration of said strip-shaped zones in said semiconductor body.

2. A semiconductor device as claimed in claim 1, wherein a metal layer is provided on the deposited semiconductor material above each of the rectifying junctions, which junctions form diodes.

3. A semiconductor device as claimed in claim 2, wherein said metal layers are provided in the form of a number of metal tracks extending over at least substantially the whole length of a conductor track.

4. A semiconductor device as claimed in claim 3, wherein said conductor tracks each comprise a double layer of a track of semiconductor material of the first conductivity type which extends over the whole length of the semiconductor track in the windows and over the insulating layer and a track of a metal which is provided over the whole length of the conductor track on the deposited semiconductor material.

5. A semiconductor device as claimed in claim 1, wherein the surface concentration of said strip-shaped zones is at least $10^{19}$ impurities per $cm^3$.

6. A semiconductor device as claimed in claim 1, wherein the doping concentration of the polycrystalline material is at most $10^{18}$ impurities per $cm^3$.

7. A semiconductor device as claimed in claim 1, wherein metal tracks are provided above said semiconductor tracks, said metal tracks being insulated electrically from said conductor tracks and cross the same, and said metal tracks extend above and parallel to a strip-shaped zone formed in the body and are contacted in a number of places with said strip-shaped zones.

* * * * *